Figure 1:
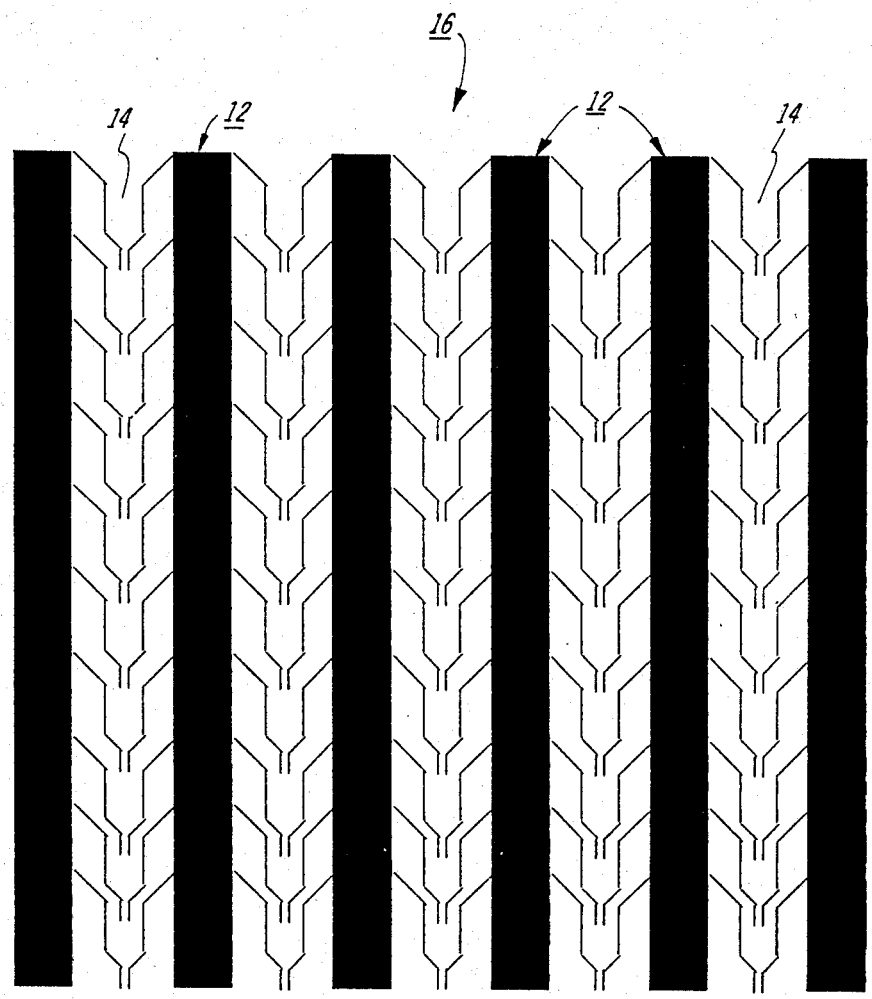

United States Patent [19]

Chiang et al.

[11] Patent Number: 4,536,251
[45] Date of Patent: Aug. 20, 1985

[54] METHOD FOR ELIMINATING LASER-INDUCED SUBSTRATE FISSURES ASSOCIATED WITH CRYSTALLIZED SILICON AREAS

[75] Inventors: Anne Chiang, Cupertino; William P. Meuli, Sunnyvale, both of Calif.

[73] Assignee: Xerox Corporation, Stamford, Conn.

[21] Appl. No.: 617,002

[22] Filed: Jun. 4, 1984

[51] Int. Cl.³ .................. B44C 1/22; C03C 15/00; C03C 25/06; C30B 13/06

[52] U.S. Cl. .................. 156/657; 156/643; 156/662; 156/617 R; 156/620; 156/DIG. 64; 156/DIG. 80; 156/DIG. 111; 156/DIG. 88; 219/121 LE; 219/121 LF

[58] Field of Search .......... 156/628, 653, 657, 659.1, 156/662, 643, 607, 617, 620, 624, DIG. 80, DIG. 64, DIG. 88, DIG. 111; 219/121 LE, 121 F

[56] References Cited

U.S. PATENT DOCUMENTS 4,330,363  5/1982  Biegesen et al. .................. 156/620
4,388,145  6/1983  Hawkins et al. .................. 156/617

Primary Examiner—William A. Powell
Attorney, Agent, or Firm—Serge Abend

[57] ABSTRACT

A method for eliminating laser induced substrate fissures associated with laser annealed crystallization of patterned silicon areas, for increasing the yield of useable single crystal areas. The fissures are created by enhanced etching of the substrate, at the exposed edges of the areas, during the removal of a dimension stabilizing encapsulating layer. A post crystallization, high temperature anneal, in an oxidizing atmosphere prevents the enhanced etching of the substrate.

10 Claims, 11 Drawing Figures

METHOD FOR ELIMINATING LASER-INDUCED SUBSTRATE FISSURES ASSOCIATED WITH CRYSTALLIZED SILICON AREAS

This invention relates to an improvement in the processing of laser crystallized semiconductor islands, for increasing the number of useable single crystal islands, so that each island may serve to support an active thin film transistor device and circuits may be made thereon. A post crystallization, high temperature anneal, in an oxidizing atmosphere, has been found to increase the yield of useable islands.

Circuits of semiconductor devices are conventionally fabricated upon wafers of monocrystalline semiconductor material, such as silicon. It is well known that formation of these wafers is severely size limited, as they comprise transverse slices of an elongated single crystal ingot (boule). Silicon boules of about six inches in diameter are presently commercially available. Portions of these wafers (chips) usually measuring somewhat larger than one-quarter inch square, incorporate the tens of thousands of active transistor devices which are capable of high speed computational tasks. Wafer-scale, single crystal, silicon circuitry (i.e., wafer size chips) is only now in its infancy and is encountering severe growing pains, primarily as a result of low yields.

As an alternative to growing and processing devices from single crystal silicon boules, with their inherent size limitations, the formation of large area, single crystal, thin films upon suitable substrates, such as glass or fused quartz, could revolutionize semiconductor technology. Elimination of the single crystal silicon wafer as the starting material for subsequent device fabrication, could result in reliable, high yield, low cost methods for formation of large area arrays of active electronic devices with switching and addressing capabilities, on a page size monolithic substrate. Unfortunately, large area single crystal films are not readily available. These films may include large grains, usually randomly located.

More recently considerable research has been conducted on annealing predefined islands of polycrystalline silicon on suitable substrates, for converting them to single crystal islands. Such a process is disclosed in U.S. Pat. No. 4,330,363 to Biegelsen et al, entitled "Thermal Gradient Control for Enhanced Laser Induced Crystallization of Predefined Semiconductor Areas", assigned to the same assignee as the instant application. In that patent, there is taught a method for converting large, usable, islands of single crystalline silicon from a polycrystalline or an amorphous starting material. An array of islands, or other prepositioned pattern of discrete area, of crystallizable semiconductor material, is formed upon the surface of a suitable substrate and is then exposed to thermal energy, such as in the form of a focussed laser source. The laser irradiation causes the areas to melt and heats the substrate. Resolidification of the patterned areas, into single crystalline form is effected by establishing a known thermal gradient thereover.

Furthermore, by encapsulating the patterned areas prior to the laser annealing step, the dimensional stability, surface texture and planarity of the discrete areas may be controlled. After patterning a suitable capping layer is deposited and, subsequent to crystallization, the capping layer is removed so that subsequent known processing steps may be implemented to form active devices on the array of single crystal islands.

Laser crystallized silicon islands on insulating substrates, formed in accordance with the teaching of the Biegelsen et al patent, have been shown to produce high performance thin film transistors (TFTs). However, a major drawback to useable large area configurations has been an extremely low yield. It has been observed that when the encapsulating layer is removed, cracks or fissures appear in the substrate, at the island edges. It apppears that the fissures are caused by enhanced etching of the substrate, at the highly stressed island edges, by the encapsulant removing etchant. High stresses are induced in the substrate by the thermal mismatch between the silicon areas and the usual fused silica substrate. Since the thermal coefficient of expansion and contraction of silicon is about six times that of the substrate, the crystallized silicon areas will have expanded and shrunk considerably more during heating and cooling, causing large compressive stresses in the substrate, along the interface with the islands. At the island edges, where the compressive stresses terminate, fissures are likely to occur. These cracks have become a major source of failure in the subsequently fabricated MOS devices, by trapping contaminants and subsequently deposited conducting layer materials, thus providing shorting paths.

Therefore, it is the object of this invention to provide a method for treating the substrate, at the edges of the crystallized silicon areas, for preventing the formation of these yield reducing cracks or fissures.

The stated object may be accomplished by practicing the steps of depositing a thin layer polycrystalline or amorphous semiconductor material upon an insulating substrate having a coefficient of thermal expansion less than the semiconductor material, patterning the layer so as to form numerous discrete areas of the semiconductor material, depositing a thin encapsulating layer over the patterned areas and the substrate, exposing the areas and the substrate to a thermal energy source for melting the areas and heating the substrate, cooling the areas and the substrate to control the resolidification of the areas into single crystals, exposing the areas and the substrate to a high temperature oxygen atmosphere and etching off the encapsulant layer. Subsequently, devices may be fabricated on discrete single crystal semiconductor islands.

Figure 2:
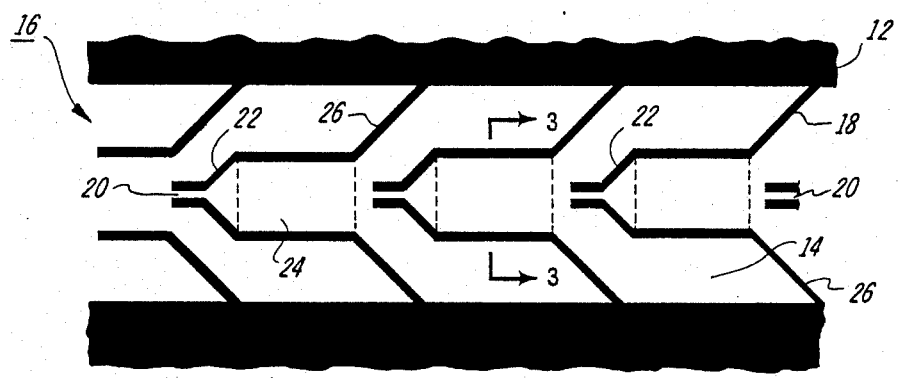
Figure 3:
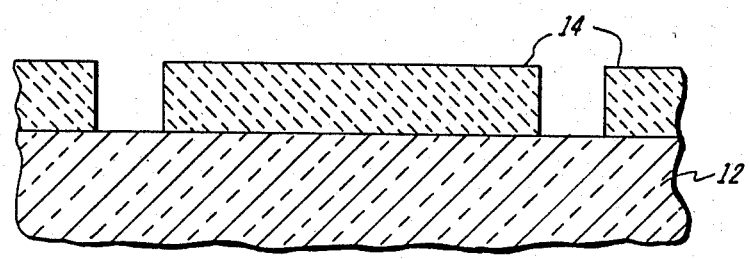
Figure 4:
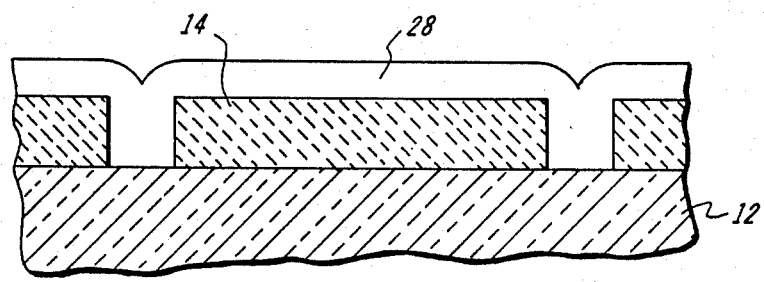
Figure 5:
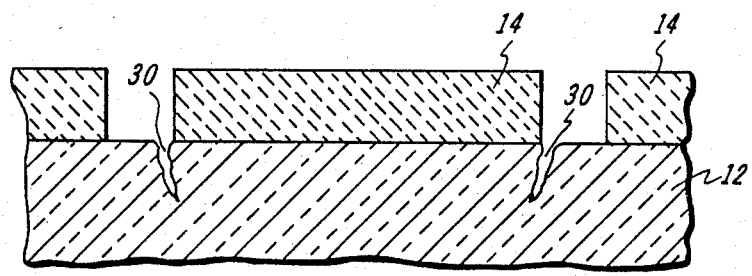
Figure 6:
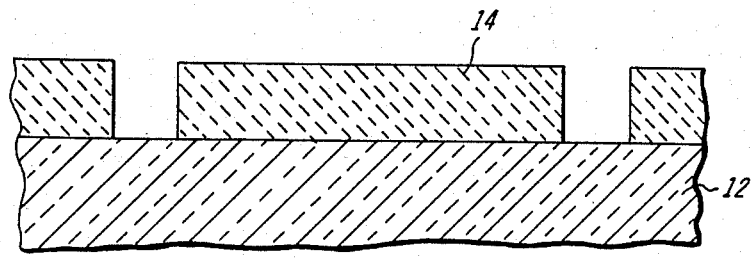
Figure 7:
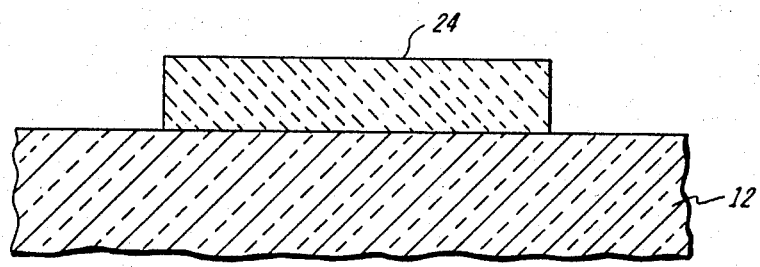
Figure 8:
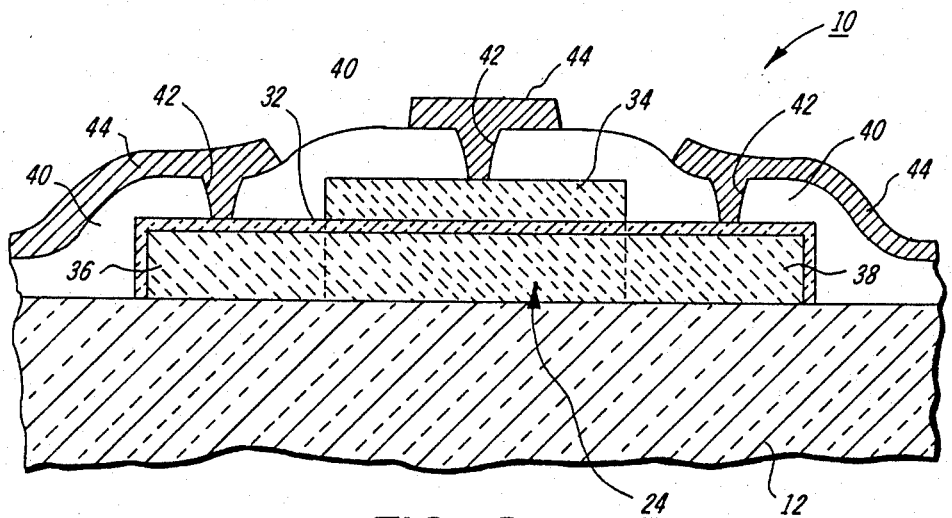
Figure 9:
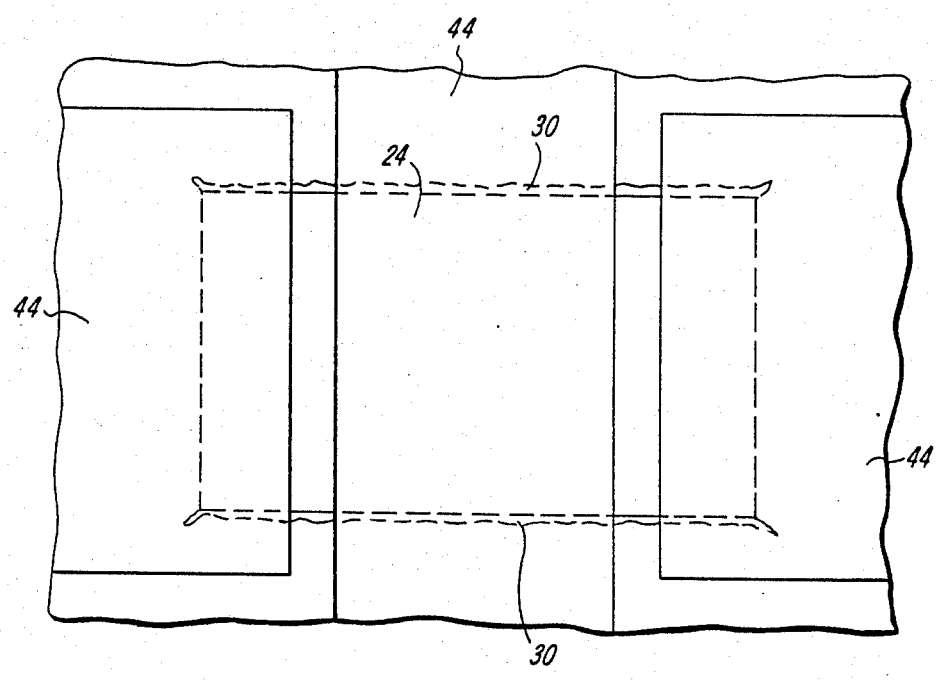
Figure 10:
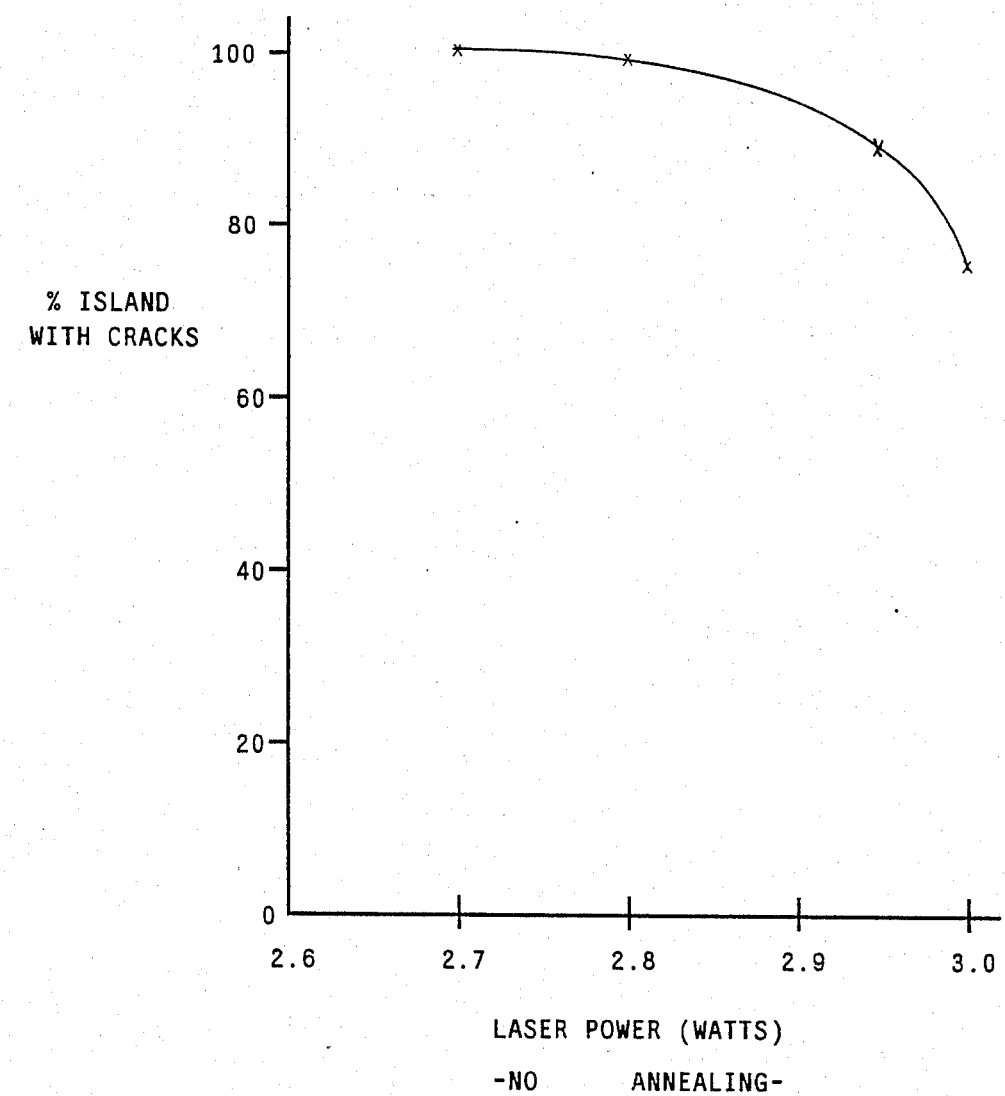
Figure 11:
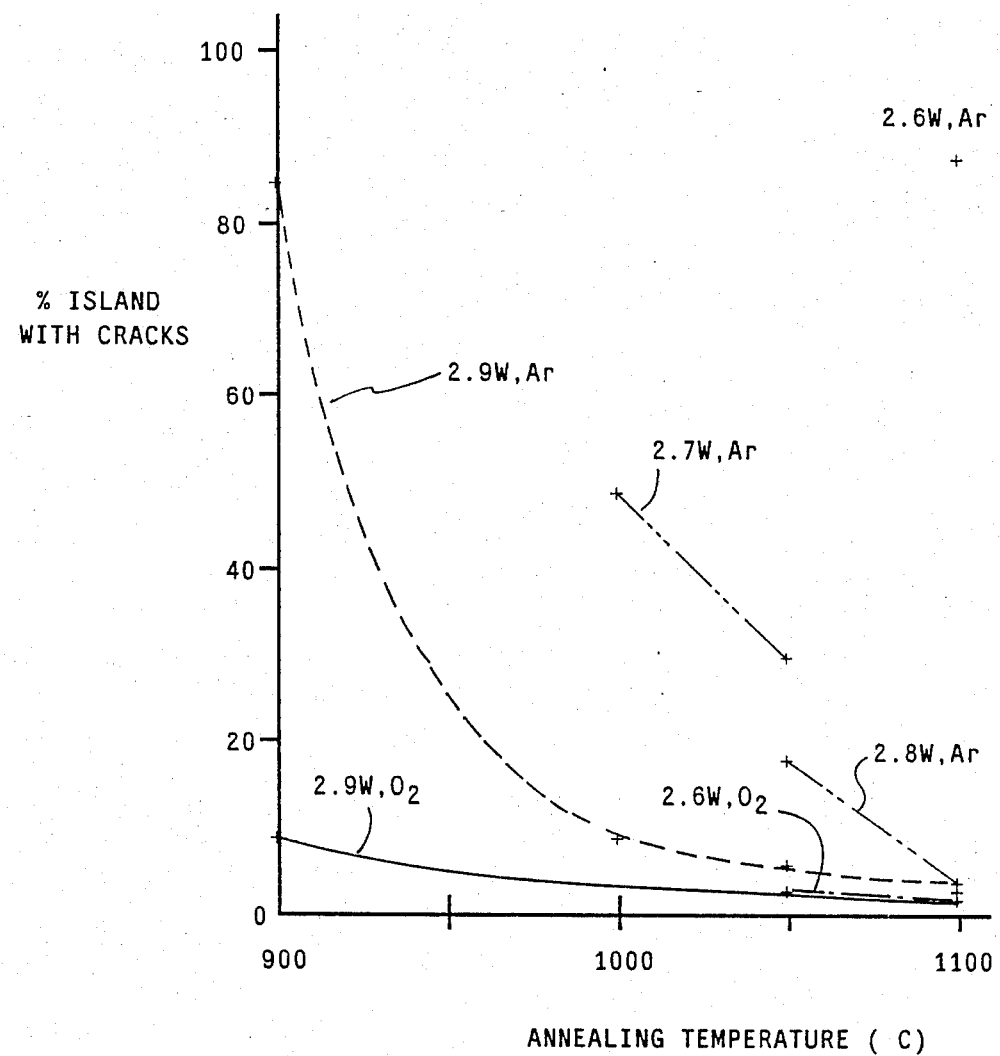

Many of the attendant advantages and the manner in which this invention may be carried out will become more readily appreciated as the same becomes better understood by reference to the following detailed description, when considered in connection with the accompanying drawings wherein:

FIG. 1 illustrates a number of patterned stripes of semiconductor material on a substrate, FIG. 2 illustrates an enlarged portion of a single stripe, FIG. 3 is a sectional view taken substantially in the direction of lines 3—3 of FIG. 2, FIG. 4 is a sectional view similar to that of FIG. 3 showing the addition af an encapsulating layer, FIG. 5 is a sectional view similar to that of FIG. 3 showing the existence of fissures in the substrate at the edges of the crystalline areas after the encapsulating layer has been removed, FIG. 6 is a sectional view similar to that of FIG. 5 showing a crack-free substrate after the encapsulating layer has been removed in accordance with the present invention, FIG. 7 is a sectional view similar to that of FIG. 3 showing the single crystal silicon island after the outboard polysilicon material has been removed, FIG. 8 is a transverse cross sectional view of the island of FIG. 7 showing a subsequently formed transistor device, FIG. 9 is a plan view of the device of FIG. 8, in which the substrate fissures, shown in FIG. 5, are present, FIG. 10 is a plot of the yield, expressed in terms of the percentage of islands with cracks relative to the magnitude of the recrystallizing laser power, and FIG. 11 is a plot of the yield, expressed in terms of the percentage of islands with cracks relative to post crystallization annealing parameters.

Turning now to the drawings in greater detail, there is illustrated in FIGS. 1 and 2 a representation of a portion of an array of recrystallizable semiconductor areas upon a suitable substrate. In FIGS. 3 through 8 there is shown the series of steps carried out on a single area to form a typical thin film transistor 10 (shown in FIG. 8). In particular, FIGS. 5 and 9 illustrate the fissure problem which has been the cause of low yields and which has been overcome by the method of the present invention.

An optically polished fused quartz ($SiO_2$) substrate 12, about 20 mils thick, or other suitable material, was provided as the starting material, upon which a thin layer of polycrystalline silicon (Si) 14, about 0.5 $\mu$m thick, was uniformly deposited by the known low pressure chemical vapor deposition (LPCVD) method. We deposited this layer in a furnace at 635° C., at a pressure of 240 mTorr and with a flow rate of silane ($SiH_4$) at 36 sccm. Fused silica is a desirable substrate because of its good electronic properties and its compatibility with integrated circuit processing lines. In particular, it does not contribute contaminants which would degrade the properties of the Si devices. This material has the undesirable property of a coefficient of thermal expansion about one-sixth that of silicon. It is this property which causes the problems solved by the present invention.

In order to create useable single crystal islands upon which active devices may be formed, the polycrystalline film was patterned and crystallized in accordance with the teaching of the above-identified Biegelsen et al patent. As stated in the patent, patterning the polycrystalline material is accomplished for controlling single crystal growth in each of the areas, or islands, by controlling the the thermal profile across the island.

The polycrystalline film was patterned in a known manner by masking the film with a suitable photoresist and etching. Various patterns may be used to delineate the thin polycrystalline film and facilitate crystal growth. For example, stand alone islands or moated islands, as disclosed in the Biegelsen et al patent may be formed. Alternatively, the patterned stripes shown in FIGS. 1 and 2 have been found to be particularly satisfactory. In each Figure, the white area represents stripes 16 of patterned polycrystalline material and the dark shaded area represents the exposed fused quartz substrate 12. It should be noted that the dark lines also represent the exposed substrate at the bottom of grooves, or ditches, in the polycrystalline material.

Each stripe 16 is normally 50 $\mu$m wide. The repeating unit therein is formed by 2 $\mu$m wide ditches 18, which define a narrow bottleneck 20, a taper region 22, an island body 24, and an outwardly flared opening region 26. The island body portion 24, designated for device fabrication, as shown in FIG. 2, is the rectangle defined by vertical dotted lines and horizontal dark lines. At a later stage in the process the plural island bodies of the array may be isolated by removing the surrounding material and devices may be fabricated thereon.

After patterning, we capped the polycrystalline material by the chemical vapor deposition (CVD) of a thin encapsulating layer 28 of $SiO_2$, as shown in FIG. 4. We effected this step in a furnace at about 400° C. and a pressure of 200 mTorr with flow rates of $SiH_4$ of 65 sccm and $O_2$ of 100 sccm, in order to build a layer 0.5 $\mu$m thick. In order to convert the capping layer into stoichiometric $SiO_2$, it was necessary to follow the oxide deposition step with a densification step involving heating to about 950° C. for about 30 minutes in an $O_2$ environment, flowed at 5 lpm, at atmospheric pressure. The cap provides dimensional stability to the patterned polycrystalline material during the recrystallization step which follows, during which the polycrystalline material is heated to its molten state.

Zone melting is the following step. The application of laser energy to perform this step is fully described in the above-identified Biegelsen et al patent and in U.S. Pat. No. 4,388,145 entitled "Laser Annealing for Growth of Single Crystal Semiconductor Areas" (Hawkins et al), also assigned to the same assignee as the present application. We used a continuous wave $CO_2$ laser at 2.5 to 3.0 watts, at a wavelength of 10.6 $\mu$m, having a Gaussian shaped beam approximately 300 $\mu$m in diameter, scanning at 0.025 cm/sec. As the laser beam is scanned from left to right, in FIG. 2, a microzone melting process takes place, heating the polycrystalline material to its molten state. After the laser passes, the polycrystalline material supercools and crystallizes. In addition to laser recrystallization, this step may be performed by black body radiation from a graphite strip heater, electron beam irradiation, incoherent lamp illumination, or by other suitable devices.

Following the molten zone from left to right, it should be understood that the narrow bottleneck 20 contrains passage therethrough to a single seed crystal, which grows through the taper region 22 into the island body 24. Similarly, the next bottleneck 20 in turn seeds from the preceding island to grow yet another single crystal. In the space between two repeating units, the flared opening 26 guides the molten mass flow outwardly toward the edges of the stripe, to avoid material build up in the central, island region. As described in the Hawkins et al patent, the substrate in the region of the narrow ditches 18, absorbs more laser energy than does the polycrystalline material, causing a small and controlled degree of island edge heating, thereby preventing edge nucleation and encouraging single crystal growth outwardly, from the island center.

After single crystal formation, it is necessary to remove the capping oxide layer 28. We have used a 10:1 buffered oxide etch, comprising hydrofluoric acid (HF) buffered with ammonium fluoride ($NH_4F$). It is at this juncture in the above described process that the yield reducing problem, to which the present invention is addressed, arises. At the moment the encapsulant is completely removed, cracks or fissures 30 rapidly form in the substrate 12 adjacent the edges of the island. This phenomenon is illustrated in FIG. 5. Absent the solution of the present invention, we have found that 75 to 100% of the islands showed substrate cracks along the edges (see FIG. 10). In the subsequent fabrication of thin film transistor devices, these fissures 30 have become a major source of failure, because contaminants may be trapped therein, creating shorting paths and otherwise deleteriously affecting the electronic properties of the device (see FIG. 9).

We have observed the substrate immediately prior to the complete removal of the encapsulant and have been able to find no fissures in it. Therefore, we believe that the fissures are the result of a chem-mechanical action, i.e. enhanced etching in areas of very high stresses in the substrate. Since the etchant is only exposed to the substrate outboard of the island, it is only at the island edges that the etchant may act destructively, as illustrated. The tremendous stresses are attributed to differential thermal contraction during quenching of the molten silicon brought about by differences in coefficients of thermal expansion between the fused quartz substrate and the silicon island, resulting in residual stress localized at the silicon/substrate interface. Once cooled, the silicon areas will be under tension while the fused quartz substrate will be under compression. It is believed that the compressive stress causes the interatomic arrangement to be distorted or bonds to be broken, resulting in those stressed areas becoming more vulnerable and reactive to the etching process.

One possible solution to the enhanced etching problem would appear to rely upon thermally biasing the substrate during laser crystallization of the polycrystalline islands, in order to moderate the thermal shock and to reduce the residual stress in the substrate. Another is to optimize the thermal profile passing across the stripes by shaping the scanning laser beam and redesigning the patterned stripe for minimal residual stress.

We believe that the present invention provides a superior solution since it requires less equipment than the first approach and allows more degrees of freedom in zone melting than the second. We found, initially, that an annealing step, in an inert atmosphere, such as argon (Ar), following laser crystallization, is capable of a moderate reduction in the deleterious chem-mechanical etching of the substrate, under some conditions. Unexpectedly, we have further found that high temperature annealing in an oxidizing atmosphere, such as $O_2$, is even more effective, and eliminates virtually all these cracks, over a much wider range of conditions.

The literature teaches away from the results we have obtained. For example, in the article entitled "Structural Evaluation of Silicon Oxide Films" by Pliskin et al, appearing in the October 1965 issue of the Journal of the Electrochemical Society, at pp. 1013–1019, there is described the formation of silicon dioxide films for surface passivation and diffusion masking. The films were obtained by thermal oxidation in oxygen or steam at elevated temperatures. Selective etching of the film by a solution of hydrofluoric acid, nitric acid and water is described as being sensitive to changes in oxygen content of the film, being slower for oxygen deficient films. The corrollary is that thermal oxidation increases the etch rate. This is directly contradictory to our findings as they relate to the formation of substrate fissures.

Although the exceptional effectiveness of our oxygen annealing step is not fully understood, it is believed that the enhanced etching is negated by the oxygen in some way changing the stoichiometry of the stressed substrate region. We perform this step by placing the sample in a furnace at 900° to 1100° C. at atmospheric pressure with $O_2$ passed through at a flow rate of 5 lpm. It is believed that this annealing step may also be performed effectively in a steam environment.

In the graph of FIG. 10, there is plotted the percentage of islands having substrate cracks against laser power utilized in the crystallization step. No post melting annealing was performed. It should be noted that higher power laser annealing yields fewer cracks than lower laser power. At best, we observed a 30% yield with a 3.0 watt laser. However, irradiation at this level has been found to be too high, causing the stripes to be ablated as scanning takes place.

In the graph of FIG. 11, there is plotted the percentage of islands having substrate cracks against post crystallization annealing temperatures for various combinations of laser crystallization power and annealing atmospheres. It can be seen that inert atmosphere (Ar) annealing does not significantly increase the yield of non-fissured islands, other than for the highest laser power (2.9 W) and the highest annealing temperatures (about 1000° to 1100° C.). On the other hand, oxygen annealing results in yields upward of about 90% over a broader range of laser power (2.6 to 2.9 W) and over a broader range of annealing temperatures (900° to 1100° C.).

Subsequent to the oxygen annealing step, the oxide cap 28 may be removed by the buffered oxide etch described above. As illustrated in FIG. 6 the substrate will be intact. Next the useable island area 24 is masked and defined by removing the portions of the crystallized stripe outboard of these areas, with a suitable etchant, as shown in FIG. 7.

The remaining steps of the process, for fabrication of the thin film transistor 10, illustrated in FIG. 8, are well known. They are listed here for completeness of disclosure, but no specific processing parameters are suggested. A gate oxide layer 32 is grown around the island; a back channel boron (B) implant is made in the island adjacent the substrate interface to suppress back channel leakage; if the device is to be of the enhancement-mode type, a shallow channel boron (B) implant is made adjacent the surface of the island for threshold adjustment; if the device is to be of the depletion-mode type, a shallow channel phosphorus (P) implant is made adjacent the surface of the island for threshold adjustment; a polycrystalline silicon gate electrode 34 is deposited and suitably doped; arsenic (As) is implanted in the island in source 36 and drain 38 regions; a crossover insulator layer 40 is deposited; vias 42 are cut through the insulator layer; and contact metallization 44 is deposited.

It should be understood that the present disclosure has been made only by way of example, and that changes in materials and the combination and arrangement of parts may be resorted to without departing from the true spirit and scope of the invention as hereinafter claimed.

What is claimed is:

1. A method for eliminating laser induced substrate fissures associated with crystallized silicon areas comprising the steps of
   providing a substrate,
   depositing a layer of polycrystalline semiconductor material upon said substrate,
   patterning said polycrystalline layer to form an array of areas,
   depositing an encapsulating layer over said patterned polycrystalline layer, applying thermal energy to said patterned polycrystalline layer for melting said areas and heating said substrate, cooling said areas and said substrate to control resolidification of said areas into single crystals, annealing said areas and said substrate in a heated oxidizing atmosphere, and removing said encapsulating layer by etching.

2. The method defined in claim 1 wherein said substrate and said polycrystalline semiconductor material have differrent coefficients of thermal expansion.

3. The method defined in claim 2 wherein said substrate is fused quartz, said encapsulating layer is $SiO_2$ and said semiconductor material is Si.

4. The method defined in claim 2 wherein said step of applying thermal energy comprises zone melting of said patterned polycrystalline areas.

5. The method defined in claim 2 wherein said annealing step comprises passing oxygen over said areas and said substrate.

6. The method defined in claim 5 wherein said annealing step comprises elevating the temperature of said areas and said substrate into the range from 900° to 1100° C.

7. The method defined in claim 4 wherein said step of applying thermal energy comprises scanning said areas and said substrate with a continuous wave $CO_2$ laser.

8. The method defined in claim 7 wherein said laser energy is applied in the range from 2.6 to 2.9 watts.

9. The method defined in claim 5 wherein said removing step comprises using an HF based etchant.

10. The method defined in claim 2 wherein said annealing step comprises passing steam over said areas and said substrate.

* * * * *